United States Patent
Hou et al.

(10) Patent No.: US 7,458,051 B2
(45) Date of Patent: Nov. 25, 2008

(54) ECO CELL FOR REDUCING LEAKAGE POWER

(75) Inventors: Yung-Chin Hou, Taipei (TW);
Lee-Chung Lu, Taipei (TW); Chu-Ping Wang, Hsinchu (TW); Li-Chun Tien, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 434 days.

(21) Appl. No.: 11/281,035

(22) Filed: Nov. 17, 2005

(65) Prior Publication Data

US 2007/0109832 A1 May 17, 2007

(51) Int. Cl.
*G06F 17/50* (2006.01)
(52) U.S. Cl. .................. 716/9; 716/10; 716/11; 716/12
(58) Field of Classification Search .............. 716/2, 716/1, 9–14, 17
See application file for complete search history.

(56) References Cited

U.S. PATENT DOCUMENTS

| | | | | |
|---|---|---|---|---|
| 2004/0199879 A1* | 10/2004 | Bradfield et al. | ............... | 716/1 |
| 2005/0097492 A1* | 5/2005 | Matsumura et al. | ........... | 716/10 |
| 2005/0235240 A1* | 10/2005 | Tien | ........................... | 716/11 |
| 2006/0259887 A1* | 11/2006 | Tretz | ............................. | 716/9 |

* cited by examiner

*Primary Examiner*—Paul Dinh
(74) *Attorney, Agent, or Firm*—K&L Gates LLP

(57) ABSTRACT

A semiconductor structure including at least one spare cell is disclosed. The semiconductor structure includes a first conductive line coupled to a power supply, and a second conductive line coupled to a complementary power supply. At least one spare cell is decoupled from the first or second conductive line for being selectively connected to at least one normally functioning electronic components, the first conductive line and the second conductive line only during a rerouting process for reducing leakage power of the semiconductor structure.

12 Claims, 7 Drawing Sheets

ECO CELL FOR REDUCING LEAKAGE POWER

BACKGROUND

The present invention relates generally to integrated circuit (IC) designs, and more particularly to an engineering change order (ECO) cell for reducing leakage power of IC.

An IC includes a great number of electronic devices, cells and circuit modules for carrying out certain functions as required by design specifications. These devices, cells and circuit modules are typically constructed on a semiconductor substrate overlaid by a number of metal levels, at which conductive patterns are deployed as an interconnection network. Besides these normally functioning electronic components, the IC also has some spare or "dummy" cells that do not play an active role in the IC operation. While the spare cells may be designed to carry out certain functions, they are not connected to the normally functioning electronic components according to the original circuit design of the IC. Some of the spare cells can be selectively connected to the normally functioning electronic components, during the revising or rerouting process of the IC. This process is often referred to as an ECO, and the spare cells can be alternatively referred to as ECO cells.

The ECO cells occupy approximately five to ten percent of the total cell count in a typical IC. Conventionally, the ECO cells are coupled to a power supply and ground, even though they are not connected to other electronic components in the IC. As a result, a significant amount of power would leak through those ECO cells. For example, the ECO cells typically account for approximately ten to fifteen percent of leakage power of an IC manufactured using the 90 nm semiconductor processing technology. This power leakage problem becomes more severe when the semiconductor processing technology advances and the IC continues to shrink in size.

Thus, desirable in the art of IC design are ECO cells that can reduce the leakage power of IC.

SUMMARY

The present invention discloses a semiconductor structure. In one embodiment, the semiconductor structure includes a first conductive line for connecting to a power supply, and a second conductive line for connecting to a complementary power supply. At least one spare cell is decoupled from the first or second conductive line for being selectively connected to at lease one normal cell, the first conductive line and the second conductive line only when an engineering change order is placed.

The construction and method of operation of the invention, however, together with additional objectives and advantages thereof will be best understood from the following description of specific embodiments when read in connection with the accompanying drawings.

DESCRIPTION

Figure 1:
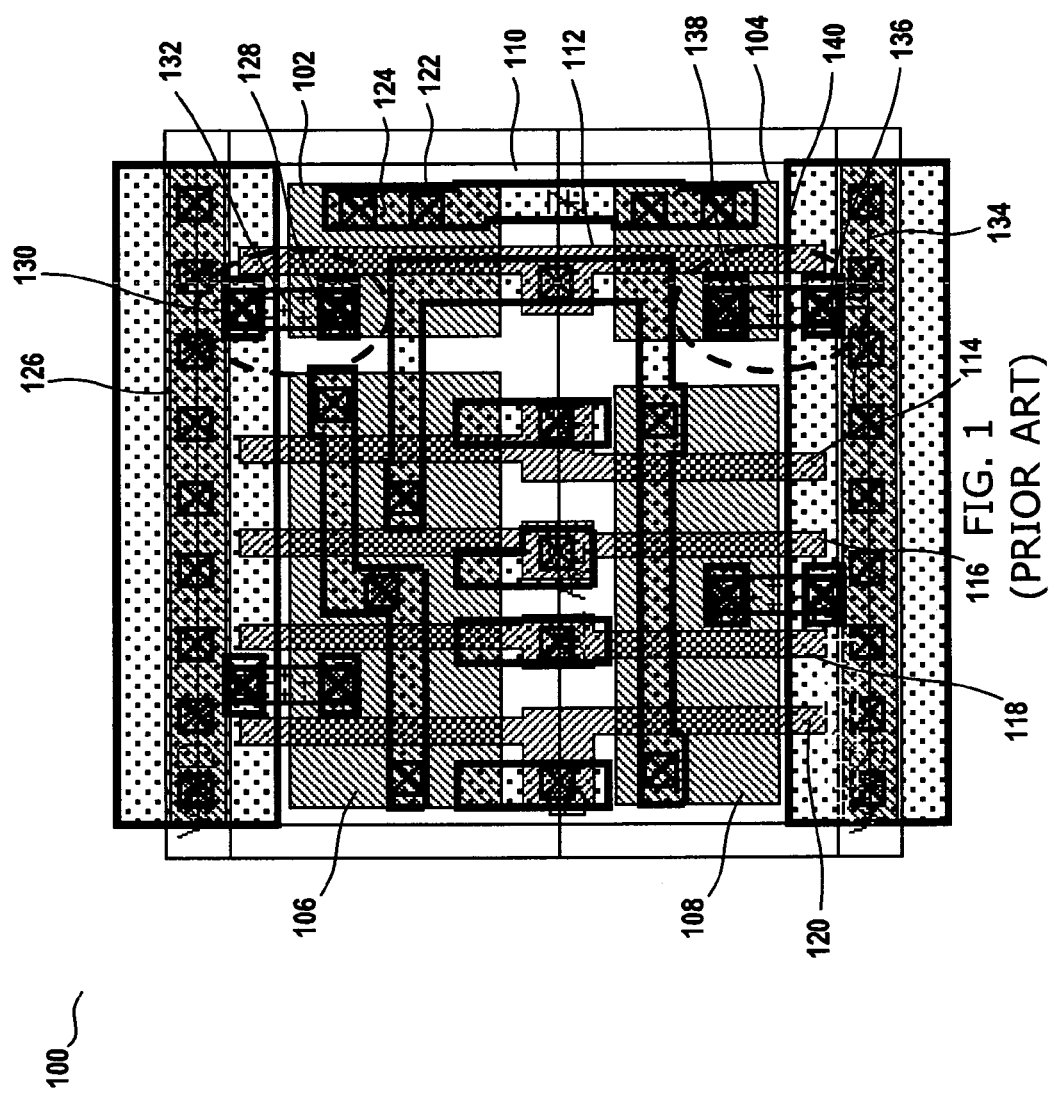
FIG. 1 illustrates a layout view of a conventional ECO cell.

FIG. 1 illustrates a layout view of a conventional ECO cell 100, which is constructed on a number of doped regions 102, 104, 106 and 108 on a semiconductor substrate 110. An elongated gate structure 112 overlies the doped regions 102 and 104, while a number of elongated gates structures 114, 116, 118 and 120 overly the doped regions 106 and 108. The doped regions 102, 104, 106 and 108 are coupled together by via contacts such as 122 and conductive patterns such as 124, so that the ECO cell 100 can carry out certain electrical functions. The doped region 102 is connected to a first conductive line 126 through via contacts 128 and 130, and a conductive pattern 132 therebetween. The doped region 104 is connected to a second conductive line 134 through via contacts 136 and 138, and a conductive pattern 140 therebetween. Similarly, the doped regions 106 and 108 are connected to the first and second conductive lines 126 and 134 through via contacts and conductive patterns. The first conductive line is further coupled to a power supply (not shown in the figure) and the second conductive line is further coupled to a complementary power supply (not shown in the figure), such as ground.

While the ECO cell 100 is not connected to any normally functioning cells before a corresponding ECO is placed, they are coupled to the power supply and the complementary power supply via the first and second conductive lines 126 and 134. This can induce a significant amount of leakage power. This power leakage problem becomes more severe when the semiconductor processing technology advances and the IC continues to shrink in size.

Figure 2A:
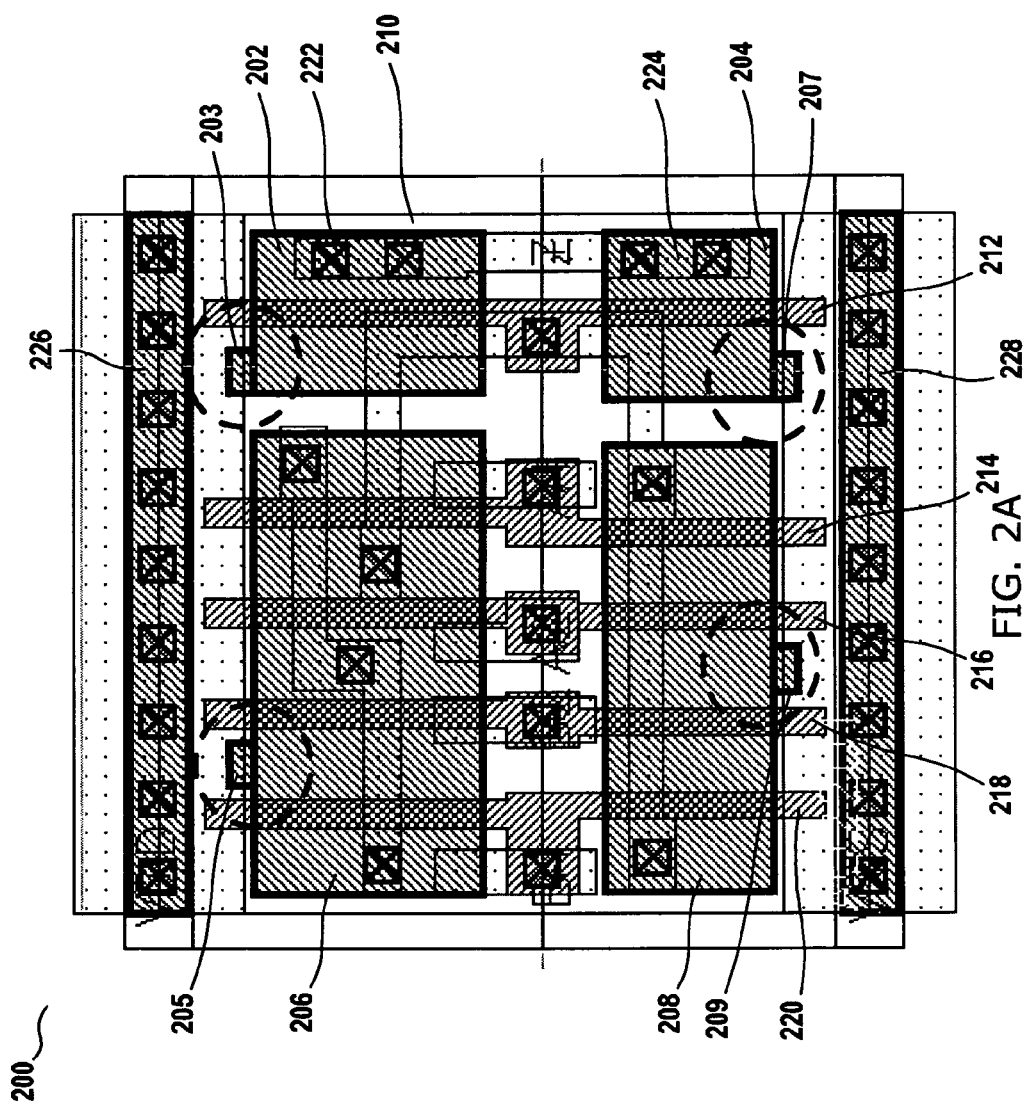
FIG. 2A illustrates a layout view of an unconnected ECO cell in accordance with a first embodiment of the present invention.

FIG. 2A illustrates a layout view of an ECO cell 200, which is constructed on a number of doped regions 202, 204, 206 and 208 on a semiconductor substrate 210 in accordance with a first embodiment of the present invention. An elongated gate structure 212 overlies the doped regions 202 and 204, while a number of elongated gates structures 214, 216, 218 and 220 overly the doped regions 206 and 208. Each of the gate structures 212, 214, 216, 218 and 220 is formed by a conductive layer, such as polysilicon, stacked upon a dielectric layer, such as silicon nitride or silicon oxide. The doped regions 202, 204, 206 and 208 are coupled together by via contacts such as 222 and conductive patterns such as 224, so that the ECO cell 200 can carry out certain electrical functions. A first conductive line 226 is disposed adjacent to the doped regions 202 and 206, and is adapted for connecting to a power supply (not shown in the figure). A second conductive line 228 is disposed adjacent to the doped regions 204 and 208, and is adapted for connecting to a complementary power supply (not shown in the figure), such as ground. The doped region 202 has a tab portion 203 protruding toward the first conductive line 226, without forming an electrical and physical connection therebetween. The doped region 206 has a tab portion 205 protruding toward the first conductive line 226, without forming an electrical and physical connection therebetween. Similarly, the doped regions 204 and 208 have tab portions 207 and 209 protruding toward the second conductive line 228, without forming electrical and physical connections therebetween, respectively. The ECO cell 200 is not coupled to any normally functioning cells before an ECO is placed.

Figure 2B:
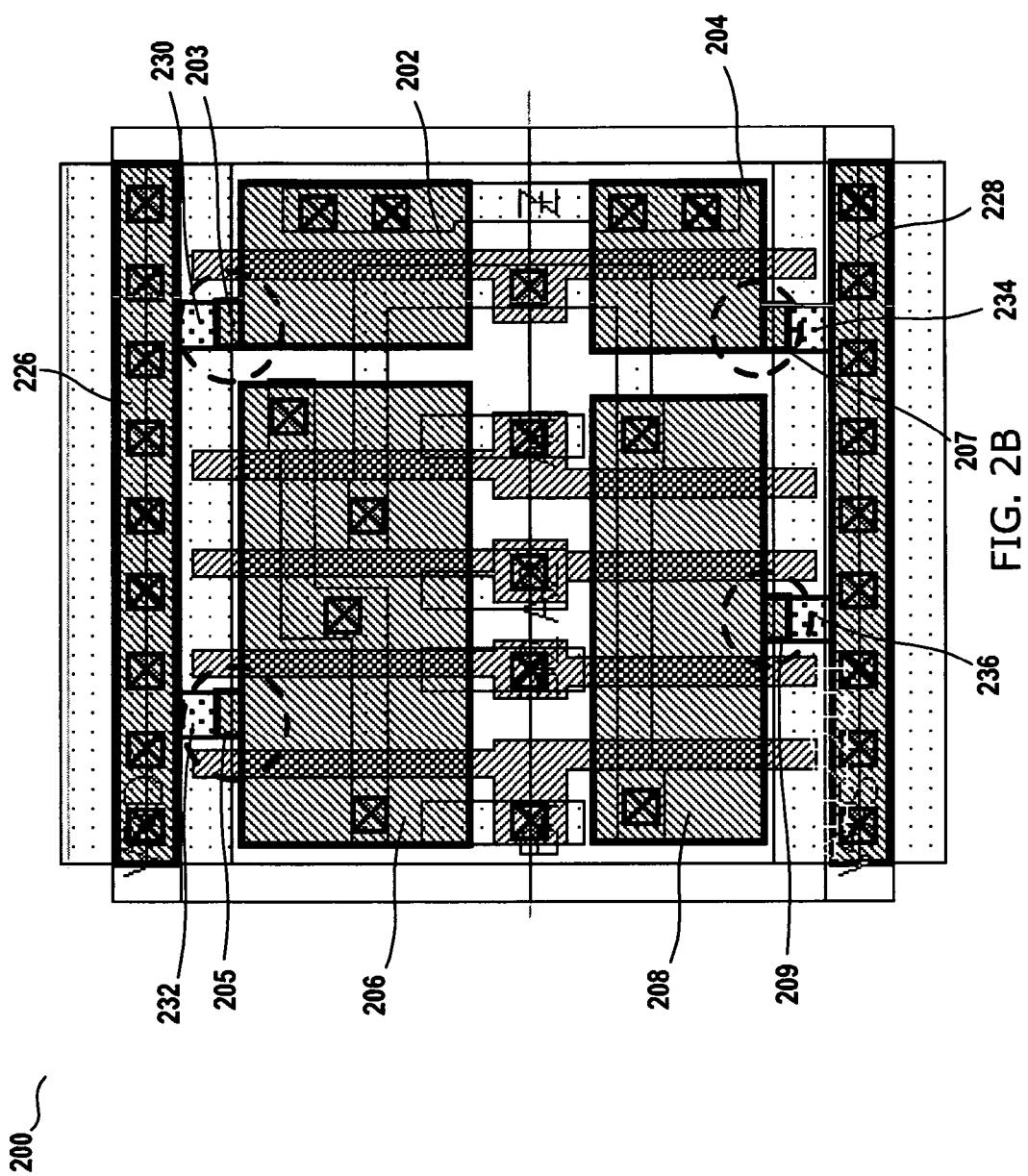
FIG. 2B illustrates a layout view of a connected ECO cell in accordance with the first embodiment of the present invention.

FIG. 2B illustrates a layout view of the ECO cell 200 after the ECO is placed in accordance with the first embodiment of the present invention. The ECO can be placed to connect the ECO cell 200 with other normally functioning cells when an IC needs to be revised or rerouted. In this embodiment, active areas 230 and 232 are formed for connecting the tab portions 203 and 205 to the first conductive line 226, respectively, while active area 234 and 236 are formed for connecting the tab portions 207 and 209 to the second conductive line 228, respectively. The active areas 230, 232, 234 and 236 are the semiconductor regions heavily doped with impurities for functioning as conductive paths. They are often defined by isolation structures such as oxide regions. Thus, they are also commonly referred to as oxide defined (OD) regions. The active areas 230, 232, 234 and 236 connect the doped regions 202, 204, 206 and 208 to the power supply and the complementary power supply via the first and second conductive lines 226 and 228, such that the ECO cell 200 can be powered up to carry out it predetermined functions.

One advantage of the present invention is that the proposed ECO cell 200 eliminates the leakage power before an ECO is placed. Unlike the conventional ECO cell 100 shown in FIG. 1, the ECO cell 200 is not connected to the first conductive line 226 or the second conductive line 228, before the ECO is placed. In other words, the ECO cell 200 is cut off from the power supply and/or the complementary power supply. Thus, no power can leak via the ECO cell 200 from the power supply to the complementary power supply. This significantly saves the power consumption of an IC, especially the one manufactured using lower than 90 nm semiconductor processing technology.

Another advantage of the present invention is its simplicity in connecting the ECO cell 200 to the power supply and the complementary power supply via the first and second conductive lines 226 and 228, when the ECO is placed. Such connection can be formed by simply revising the mask used in the step of the forming the doped regions 202, 204, 206 and 208 to form the additional tab portions 203, 205, 207 and 209. Thus, only one layer of the IC layout needs to be changed when the ECO is placed.

It is noted that the drawings in FIGS. 2A and 2B are for purposes of description. By no means are they intended to propose or suggest any specific circuit designs. Thus, the number and configuration of the doped regions, tab portions, gate structures and active areas can vary depending on specification requirements. The connection network among the doped regions, tab portions, gate structures and active areas can also vary depending on the specification requirements.

Figure 3A:
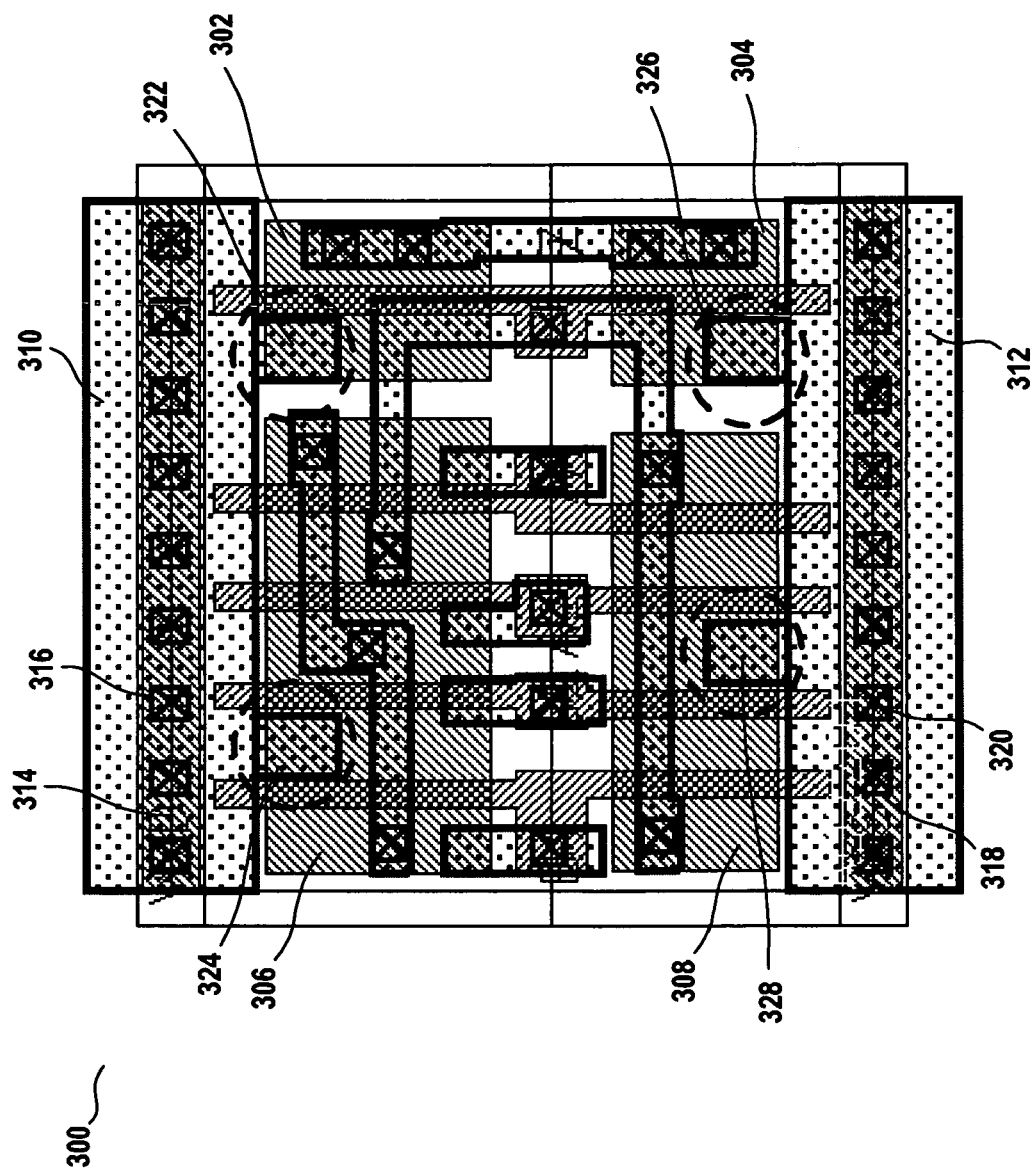
FIG. 3A illustrates a layout view of an unconnected ECO cell in accordance with a second embodiment of the present invention.
Figure 3B:
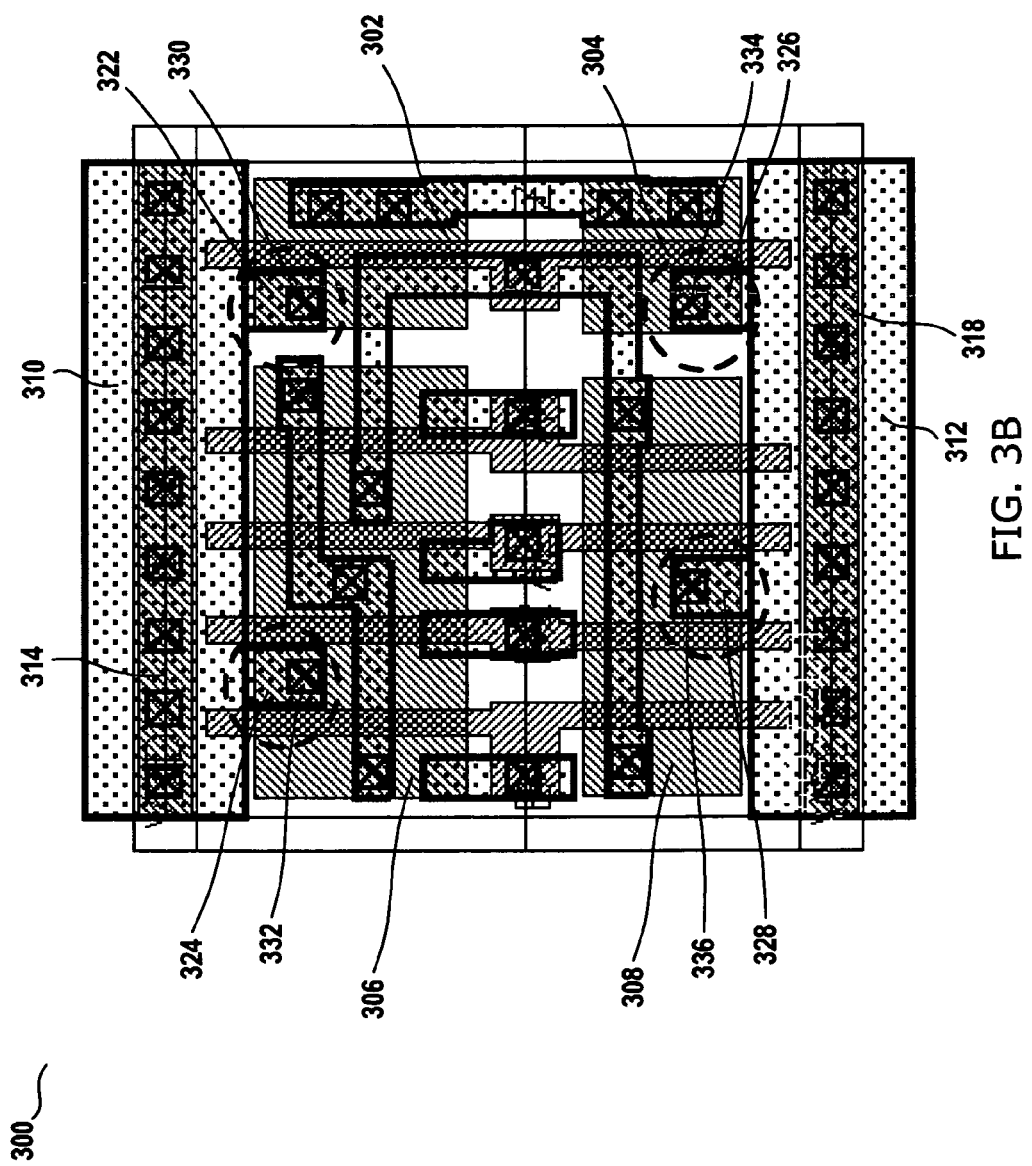
FIG. 3B illustrates a layout view of a connected ECO cell in accordance with the second embodiment of the present invention.

FIGS. 3A and 3B illustrate top views of an ECO cell 300 before and after an ECO is placed in accordance with a second embodiment of the present invention. Referring to FIG. 3A, the ECO cell 300 is very similar to the ESC cell 200 shown in FIG. 2A, except that a number of conductive patterns, such as 310 and 312, at a metal level above the doped regions 302, 304, 306 and 308 are depicted therein. The conductive pattern 310 is connected to a first conductive line 314, which is further coupled to a power supply (not shown in the figure), through a number of via contacts 316. The conductive pattern 312 is connected to a second conductive line 318, which is further connected to a complementary power supply (not shown in the figure), through a number of via contacts 320. The conductive pattern 310 has tab portions 322 and 324 hanging above the doped regions 302 and 306, without being electrically and physically in touch with the same, respectively. The conductive pattern 312 has tab portions 326 and 328 hanging above the doped regions 304 and 308, without being electrically and physically in touch with the same, respectively. Thus, no power can leak from the power supply to the complementary power supply via the ECO cell 300.

FIG. 3B shows that the ECO cell 300 is connected to the first and second conductive lines 314 and 318, therefore the power supply and the complementary power supply, after the ECO is placed. Via contacts 330 and 332 are implemented for connecting the tab portions 322 and 324 of the conductive pattern 310 to the doped regions 302 and 306, respectively. Via contacts 334 and 336 are implemented for connecting the tab portions 326 and 328 of the conductive pattern 312 to the doped regions 304 and 308, respectively. The cell 300 is further coupled to other normally functioning cells. Thus, it can be used also as a normally functioning cell after the ECO is completed.

Figure 4A:
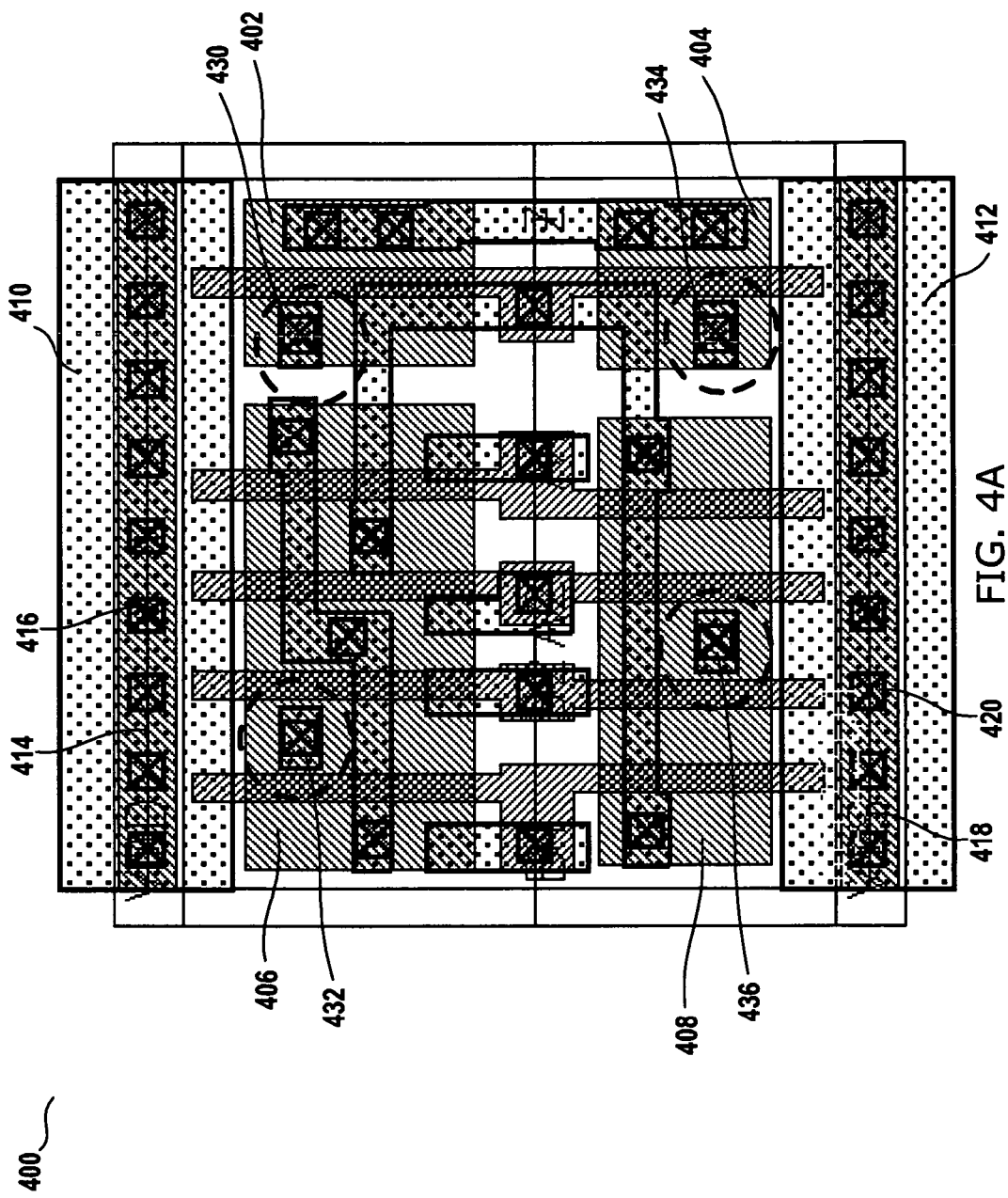
FIG. 4A illustrates a layout view of an unconnected ECO cell in accordance with a third embodiment of the present invention.
Figure 4B:
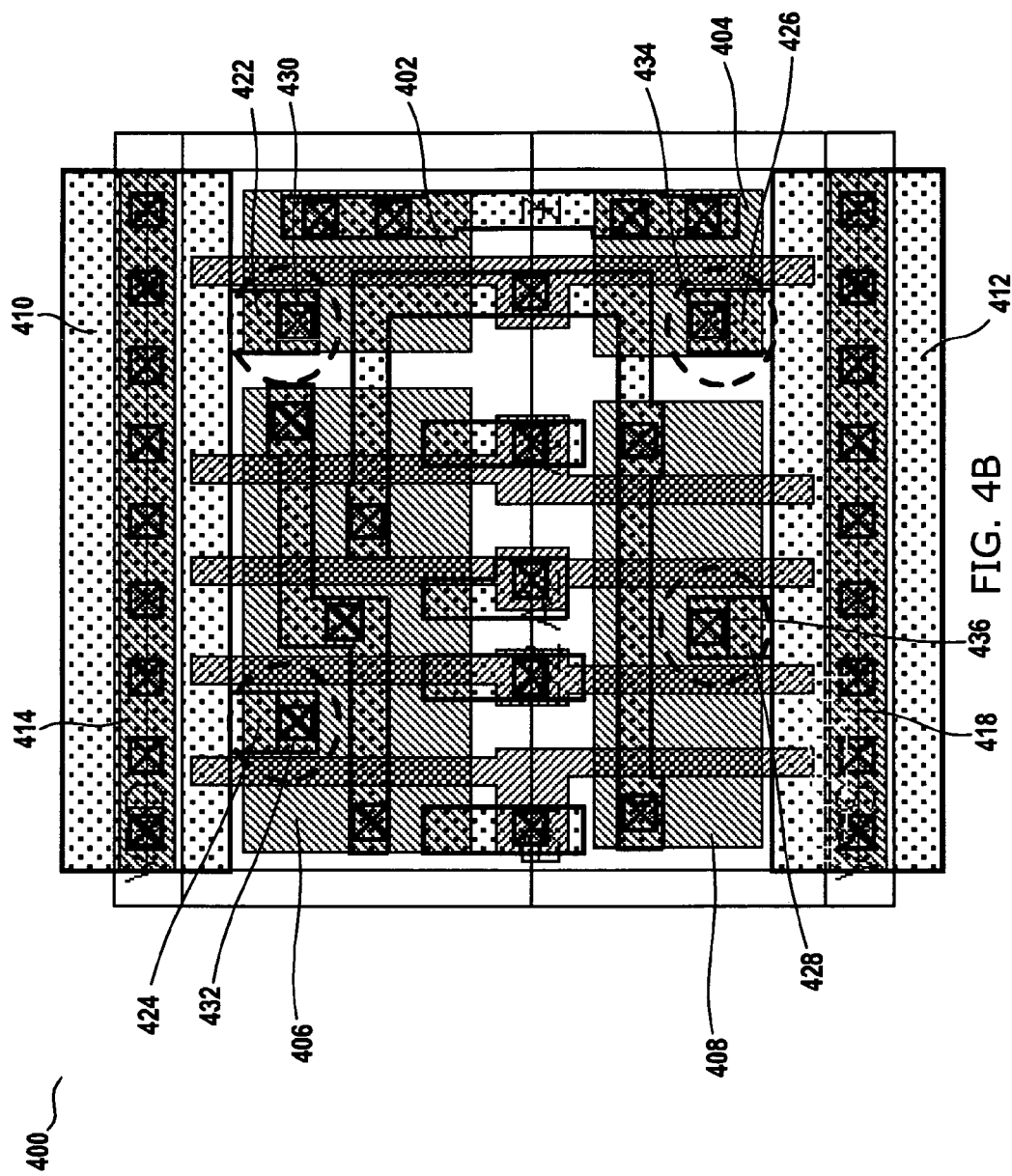
FIG. 4B illustrates a layout view of a connected ECO cell in accordance with the third embodiment of the present invention.

FIGS. 4A and 4B illustrate top views of an ECO cell 400 before and after an ECO is placed in accordance with a third embodiment of the present invention. Referring to FIG. 4A, the ECO cell 400 is very similar to the ESC cell 200 shown in FIG. 2A, except that a number of conductive patterns, such as 410 and 412, at a metal level above the doped regions 402, 404, 406 and 408 are depicted therein. The ECO cell 400 is also different from the ECO cell 200 in that the via contacts 430, 432, 434 and 436 are constructed on the doped regions 402, 406, 404 and 408, respectively. The conductive pattern 410 is connected to a first conductive line 416, which is further coupled to a power supply (not shown in the figure), through a number of via contacts 416. The conductive pattern 412 is connected to a second conductive line 418, which is further connected to a complementary power supply (not shown in the figure), through a number of via contacts 420. Neither the conductive lines 414 and 418, nor the conductive patterns 410 and 412 are connected to the doped regions 402, 404, 406 and 408. Thus, no power can leak from the power supply to the complementary power supply via the ECO cell 400.

FIG. 4B shows that the ECO cell 400 is connected to the first and second conductive lines 414 and 418, therefore the power supply and the complementary power supply, after the ECO is placed. The tab portions 422 and 424 are implemented for connecting the via contacts 430 and 432 to the conductive pattern 410, respectively. The tab portions 426 and 428 are implemented for connecting the via contacts 434 and 438 to the conductive line 412, respectively. The cell 400 is further coupled to other normally functioning cells. Thus, it can be used also as a normally functioning cell after the ECO is completed.

It is understood that while the second and third embodiments use a metal level above the doped regions for explaining the principles of the present invention, the metal level may or may not be immediately above the substrate level. It can be one or several levels above the substrate level. In the second embodiment, each metal level can include conductive patterns with tab portions for readily being connected to the doped regions by implementing additional via contacts after the ECO is placed. In the third embodiment, each metal level can include via contacts for readily being connected to the doped regions by implementing additional tab portions attached to the conductive patterns after the ECO is placed. As such, the ECO cell can be connected to the conductive lines with simple process modifications.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A semiconductor structure comprising:
   a first conductive line for connecting to a power supply;
   a second conductive line for connecting to a complementary power supply; and
   at least one spare cell including one or more doped regions, the doped regions being coupled together by via contacts and conductive patterns so that the spare cell carries out certain predetermined functions,
   wherein the spare cell is unconnected from the first or second conductive line for being selectively connected to at least one normally functioning electronic component, the first conductive line and the second conductive line only during a rerouting process of the semiconductor structure for reducing leakage power,
   wherein the spare cell comprises one or more gate structures overlying the doped regions,
   wherein one or more active areas coupled between the doped regions and the first and second conductive lines for connecting the spare cell to the power supply and the complementary power supply via the first and second conductive lines during the rerouting process of the semiconductor structure.

2. The semiconductor structure of claim 1 wherein the spare cell comprises one or more via contacts formed on the doped regions.

3. The semiconductor structure of claim 2 further comprising one or more conductive patterns at a metal level above the doped regions for connecting the via contacts to the first and second conductive lines during a rerouting process of the semiconductor structure.

4. The semiconductor structure of claim 1 further comprising one or more conductive patterns coupled to the first and second conductive lines at a metal level above the doped regions.

5. The semiconductor structure of claim 4 further comprising one or more via contacts coupled between the conductive patterns and the doped regions.

6. An integrated circuit comprising:
   a first conductive line coupled to a power supply;
   a second conductive line coupled to a complementary power supply;
   at least one normally functioning electronic component coupled to the first and second conductive lines;
   at least one spare cell including one or more doped regions, the doped regions being coupled together by via contacts and conductive patterns so that the spare cell carries out certain predetermined functions, wherein the spare cell is unconnected from the first or second conductive line for being selectively connected to at least one normally functioning electronic component, the first conductive line and the second conductive line only during a rerouting process of the integrated circuit for reducing leakage power; and
   means for connecting the spare cell to the first and second conductive lines during the rerouting process of the integrated circuit,
   wherein the spare cell comprises one or more gate structures overlying the doped regions, and
   wherein the means for connecting comprises one or more active areas coupled between the doped regions and the first and second conductive lines for connecting the spare cell to the power supply and the complementary power supply via the first and second conductive lines during the rerouting process of the integrated circuit.

7. The integrated circuit of claim 6 wherein the spare cell comprises one or more via contacts formed on the doped regions.

8. The integrated circuit of claim 7 the means for connecting comprises one or more conductive patterns at a metal level above the doped regions for connecting the via contacts to the first and second conductive lines during a rerouting process of the integrated circuit.

9. The integrated circuit of claim 6 further comprising one or more conductive patterns coupled to the first and second conductive lines at a metal level above the doped regions.

10. The integrated circuit of claim 9 the means for connecting further comprises one or more via contacts coupled between the conductive patterns and the doped regions.

11. A method for rerouting an integrated circuit, comprising:
    constructing at least one spare cell unconnected from a first conductive line which is coupled to a power supply or unconnected from a second conductive line which is coupled to a complementary power supply; and
    connecting the spare cell to normally functioning electronic components, the first and second conductive lines only during a rerouting process of the integrated circuit for reducing leakage power,
    wherein the spare cell includes one or more doped regions being coupled together by via contacts and conductive patterns so that the spare cell carries out certain predetermined functions,
    wherein the step of connecting further comprises forming at least one active area between at least one doped region, on which the spare cell is constructed, and the first and second conductive lines, and
    wherein the step of connecting further comprises forming at least one via contact between at least one doped region, on which the spare cell is constructed, and at least one conductive pattern coupled to the first and second conductive lines at a metal level above the doped region.

12. The method of claim 11 wherein the step of connecting further comprises forming at least one conductive pattern between the first and second conductive lines and at least one via contact on at least one doped region, on which the spare cell is constructed.

* * * * *